United States Patent
Moran

(10) Patent No.: US 7,133,429 B2
(45) Date of Patent: Nov. 7, 2006

(54) LASER DRIVER CIRCUIT WITH SIGNAL TRANSITION ENHANCEMENT

(75) Inventor: Timothy G. Moran, San Jose, CA (US)

(73) Assignee: Finisar Corporation, Sunnyvale, CA (US)

( * ) Notice: Subject to any disclaimer, the term of this patent is extended or adjusted under 35 U.S.C. 154(b) by 0 days.

(21) Appl. No.: 11/075,064

(22) Filed: Mar. 4, 2005

(65) Prior Publication Data

US 2005/0196177 A1    Sep. 8, 2005

Related U.S. Application Data

(60) Provisional application No. 60/550,546, filed on Mar. 5, 2004, provisional application No. 60/550,518, filed on Mar. 5, 2004.

(51) Int. Cl.
*H01S 3/00* (2006.01)
(52) U.S. Cl. .................................. 372/38.02; 372/38.07
(58) Field of Classification Search .............. 372/38.02
See application file for complete search history.

(56) References Cited

U.S. PATENT DOCUMENTS

2003/0044108 A1* 3/2003 Jacobowitz et al. .......... 385/24

OTHER PUBLICATIONS

U.S. Appl. No. 11/071,714, filed Mar. 3, 2005 entitled "Laser Driver Circuit for Reducing Electromagnetic Interference."

* cited by examiner

*Primary Examiner*—Minsun Oh Harvey
*Assistant Examiner*—Dung Nguyen
(74) *Attorney, Agent, or Firm*—Workman Nydegger

(57) ABSTRACT

A laser driver circuit with signal transition enhancement is disclosed. The laser driver circuit comprises a pair of laser driver input terminals, a current modulator circuit, a transition boost circuit, and a nonlinear integrator circuit. The pair of laser driver input terminals are configured to receive a pair of differential input signals. The current modulator circuit generates a pair of current modulator output signals in accordance with the pair of differential input signals. The transition boost circuit generates a pair of transition boost signals for enhancing signal transitions of the pair of current modulator output signals. The nonlinear integrator circuit integrates the pair of transition boost signals to generate a pair of differential current output signals.

7 Claims, 10 Drawing Sheets

LASER DRIVER CIRCUIT WITH SIGNAL TRANSITION ENHANCEMENT

CROSS-REFERENCE TO RELATED APPLICATIONS

This application claims the benefit of U.S. Provisional Application No. 60/550,546, titled A Laser Driver Circuit With Signal Transition Enhancement filed Mar. 5, 2004, which is incorporated herein by reference and U.S. Provisional Application No. 60/550,518, titled A Laser Driver Circuit For Reducing Electromagnetic Interference, filed Mar. 5, 2004, which is incorporated herein by reference.

BACKGROUND OF THE INVENTION

1. The Field of the Invention

The present invention relates to the field of high-speed data communication. In particular, the present invention relates to a circuit and method for reducing electromagnetic interference in a data communication system.

2. Description of the Related Art

In high speed optical communication systems, laser signals can be used to transmit information. For example, a laser driver circuit is used to drive and modulate the amount of electric current to be received by a laser diode. The laser diode emits a laser signal in response to the magnitude of the electric current received.

A conventional laser driver circuit may be implemented with a plurality of differential amplifiers consisting of pairs of transistors for driving a pair of differential current output signals. A problem with the conventional laser driver circuit is that it generates undesirable common mode glitches as the transistors of differential amplifiers switch states from on to off or vice versa. The common mode glitches may reverberate within the laser driver circuit, causing the circuit to radiate electromagnetic noise. These common mode glitches are difficult to terminate within an integrated circuit. One potential solution is to use inductors external to the laser driver integrated circuit to terminate the output signals. However, external inductors increase the cost of the system and occupy valuable circuit board space. Hence, there is a need for a laser driver circuit that can minimize common mode glitches when the differential amplifiers of the laser driver circuit transition between states.

A conventional laser driver circuit is slow in draining the electric charges accumulated in the differential amplifier circuits and therefore results in a slow laser turn off performance. One of the design goals of the laser driver circuit is to ensure a fast signal transition for the pair of differential current output signals, especially for the high to low transition for turning off the laser diode. This design goal may be accomplished using differential amplifiers having high amplification gains in order to ensure a fast signal transition. However, having high amplification gains creates signal overshoots when the output signals transition from low to high, and the overshoots cause undesirable electromagnetic noise.

Another design goal of the amplification circuit is to minimize the electromagnetic interference created by the laser driver circuit. This design goal may be accomplished by using differential amplifiers having low amplification gains to drive the output laser signal. As a result, a design tradeoff has to be made to choose between having high or low amplification gains in the differential amplifiers, and the design is compromised because it has to choose between the adverse effect of electromagnetic interference or a slower signal transition. The adverse effect of electromagnetic interference may lead to additional system costs employed to reduce the interference problem. The adverse effect of slower signal transition may-lead to lower system performance. Therefore, there is a need for a laser driver circuit having a high amplification gain for signal transition performance and at the same time reduces the adverse side effect of electromagnetic interference.

BRIEF SUMMARY OF THE INVENTION

One embodiment includes a method of enhancing signal transitions in a digital modulated signal. The method includes generating a transition boost signal. Generating a transition boost signal includes generating a transition compensating signal. The transition compensating signal is configured to enhance transitions of the digital modulated signal. Generating a transition boost signal further includes generating a pulse shaping output signal. The pulse shaping output signal includes pulses at transitions of the digital modulated signal. Generating a transition boost signal also includes combining the transition compensating signal and the pulse shaping output signal to form the transition boost signal. The method further includes generating an output signal comprised of the digital modulated signal and the transition boost signal.

Another embodiment of the invention is directed towards a laser driver circuit. The laser driver circuit comprises a pair of laser driver input terminals, a current modulator circuit, a transition boost circuit, a nonlinear integrator circuit. The pair of laser driver input terminals are configured to receive a pair of differential input signals. The current modulator circuit generates a pair of current modulator output signals in accordance with the pair of differential input signals. The transition boost circuit generates a pair of transition boost signals for enhancing signal transitions of the pair of current modulator output signals, and where the pair of transition boost output signals are generated in accordance with the pair of differential input signals and in accordance with the current modulator circuit. The nonlinear integrator circuit integrates the pair of transition boost signals to generate a pair of differential current output signals.

These and other features of the present invention will become more fully apparent from the following description and appended claims, or may be learned by the practice of the invention as set forth hereinafter.

BRIEF DESCRIPTION OF THE SEVERAL VIEWS OF THE DRAWINGS

In order that the manner in which the above-recited and other advantages and features of the invention are obtained, a more particular description of the invention briefly described above will be rendered by reference to specific embodiments thereof which are illustrated in the appended drawings. Understanding that these drawings depict only typical embodiments of the invention and are not therefore to be considered limiting of its scope, the invention will be described and explained with additional specificity and detail through the use of the accompanying drawings in which.

DETAILED DESCRIPTION OF THE INVENTION

Figure 1:
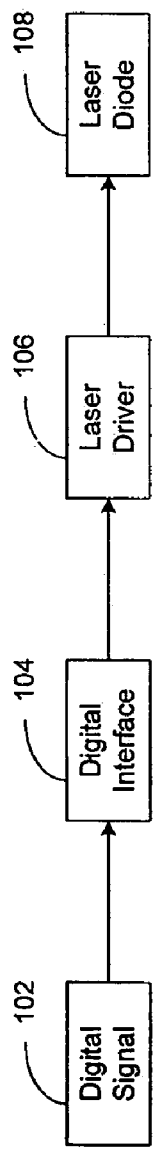
FIG. 1 illustrates a subsystem for driving an electric signal to a laser diode.

FIG. 1 illustrates a subsystem for driving an electric signal to a laser diode. A digital signal 102 is first converted into an analog signal by a digital interface circuit 104, and then it is transmitted to a laser driver circuit 106. The laser driver circuit 106 drives and modulates a current to the laser diode 108. The laser diode 108 emits light of varying intensity in response to the current received from the laser driver circuit 106.

Figure 2:
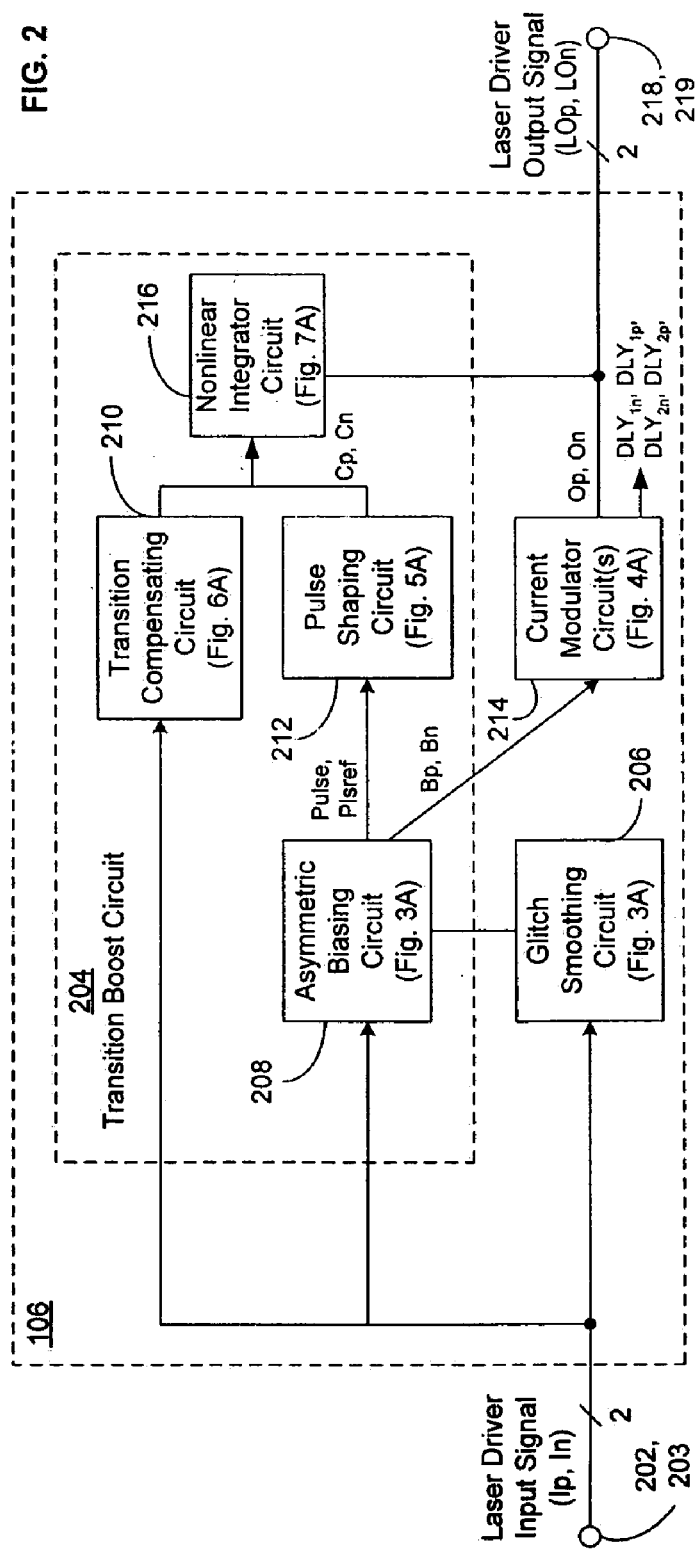
FIG. 2 illustrates a laser driver circuit of FIG. 1 according to an embodiment of the present invention.

FIG. 2 illustrates a laser driver circuit 106 of FIG. 1. The laser driver circuit includes a pair of laser driver input terminals 202, 203, a glitch smoothing circuit 206, an asymmetric biasing circuit 208, a transition compensating circuit 210, a pulse shaping circuit 212, a current modulator circuit 214, a nonlinear integrator circuit 216 and a pair of laser driver output terminals 218, 219. The pair of laser driver input terminals 202, 203 receive a pair of laser driver input signals (Ip, In) from the digital interface circuit 104. The glitch smoothing circuit 206 detects and smoothes common mode glitches generated by simultaneous switching states of differential amplifiers of the laser driver circuit 106. The current modulator circuit 214 generates a pair of current modulator output signals (Op, On) in accordance with a pair of differential bias signals (Bp, Bn) received. In some embodiments, two current modulator circuits 214 Oz are provided, with both copies connected to receive the same bias signals Bp, Bn and to contribute to the output signals LOp, LOn output at the laser driver output terminals 218, 219. In these embodiments, one copy of the current modulator circuit 214 typically has a larger output bias 214 signal, Bp, Bn, (for example, twice the output drive) of the other. Also, the current modulator circuits generate distinct delayed input signals DL YIp, DL Y In, or DL Y 2p, DL Y 2n. These delayed input signals are used as inputs to the transition compensating circuit 210, shown in FIG. 6A.

The asymmetric biasing circuit 208, transition compensating circuit 210 and the pulse shaping circuit 212 together form a transition boost circuit 204. The transition boost circuit 204 generates a pair of transition boost signals Cp, Cn for enhancing signal transitions of the pair of current modulator output signals, Op, On. The pair of transition boost signals Cp, Cn are generated in accordance with the pair of differential laser driver input signals In, Ip and in accordance with the current modulator circuit 214. The asymmetric biasing circuit 208 generates an asymmetric pulse signal (Pulse) and an asymmetric reference pulse signal (Plsref) at each signal transition of the current modulator circuit 214 in accordance with the pair of differential input signals Ip, In. The asymmetric pulse signal is biased to control the pulse shaping circuit such that the current modulator output signal Op, On is enhanced by the transition boost signals Cp, Cn so as to provide a larger signal adjustment for a negative signal transition than: a positive signal transition of the current modulator output signals Op, On. The pulse shaping circuit 212 adjusts amplitude and bandwidth of the asymmetric pulse signal to generate a pair of pulse shaping output signals. The pulse shaping circuit 212 comprises one or more pulse stretching circuits, and these pulse stretching circuit are typically connected in series. The transition compensating circuit 210 generates portions of the transition boost signals Cp, Cn including a pair of transition compensating signals in accordance with the pair of differential laser driver input signals Ip, In. The pair of transition compensating signals comprises a positive compensating pulse at each positive transition and a negative compensating pulse at each negative transition of the current modulator output signals. The positive and negative compensating pulses provide enhancements to the pair of current modulator output signals Op, On.

The nonlinear integrator circuit 216 is coupled to the output terminals of the current modulator circuit 214 and to the transition boost circuit 204. It is configured to receive the pair of current modulator output signals Op, On and the pair of transition boost signals Cp, Cn. It converts the received voltage signals to generate a pair of differential current output signals that are summed with the output signals Op, On of the current modulator circuit(s) 214 to produce laser driver output signals LOp and LOn at output terminals 218, 219. The pair of laser driver output terminals 218, 219 are configured to transmit the pair of differential current laser driver output signals LOp, LOn to the laser diode 108.

Figure 3A:
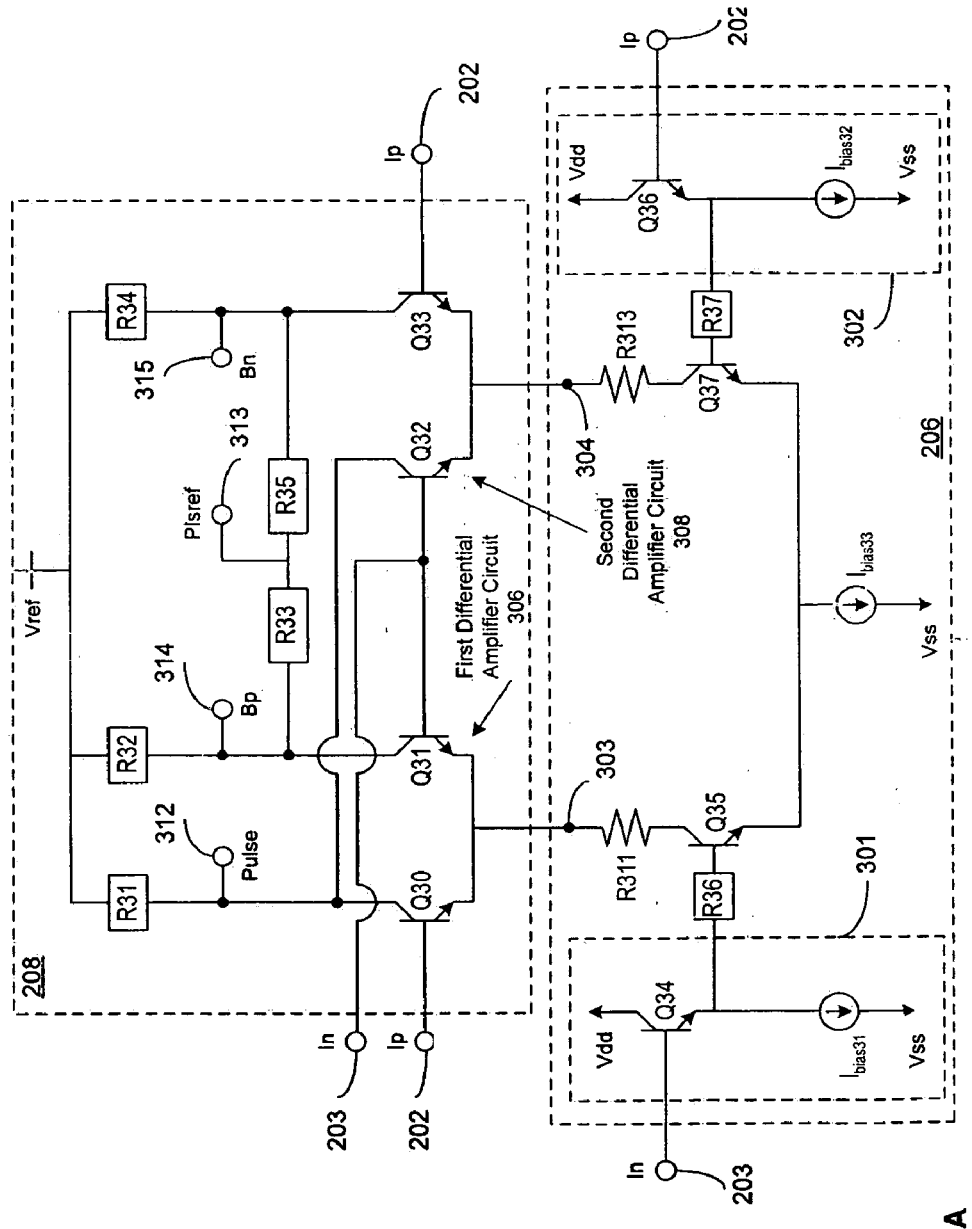
FIG. 3A illustrates an implementation of the glitch smoothing circuit and the asymmetric biasing circuit of FIG. 2.

FIG. 3A illustrates an implementation of he glitch smoothing circuit 206 and the asymmetric biasing circuit 208 of FIG. 2. The glitch smoothing circuit includes a pair of input buffer circuits 301 and 302 having a pair of input ports 202, 203 coupled to the pair of differential laser driver input signals Ip, In respectively. The pair of input buffer circuits 301 and 302 isolate the glitch smoothing circuit 206 from the digital interface circuit 104 (FIG. 1) and set a voltage range for the glitch smoothing circuit 206 to operate.

The pair of input buffer circuits 301, 302 comprises transistors Q34 and Q36. The transistor Q34 has a collector terminal coupled to a power supply voltage source (Vdd), a base terminal coupled to a first input signal (In) of the pair of differential laser driver input signals Ip, In, and an emitter terminal coupled to a first bias current source ($I_{bias31}$). The transistor Q36 has a collector terminal coupled to a power supply (Vdd), a base terminal coupled to a second input (Ip) of the pair of differential laser driver input signals Ip, In, and an emitter terminal coupled to a second bias current source ($I_{bias32}$). Transistors Q34 and Q36 are used as level shifters. In the embodiment shown in FIG. 3A, these transistors also perform a signal delay function due to the RC combination of the transistor output capacitance in series with a resistor (R36, R37).

The glitch smoothing circuit 206 further includes a pair of resistor networks R36 and R37, transistors Q35 and Q37, and a third bias current source ($I_{bias33}$). The transistor Q35 has a collector terminal coupled to a first output terminal 303 of the glitch smoothing circuit 206 through a resistor R311, a base terminal coupled to the emitter terminal of transistor Q34 through the resistor network R36, and an emitter terminal coupled to the third bias current source ($I_{bias33}$). The transistor Q37 has a collector terminal coupled to a second output terminal 304 of the glitch smoothing circuit 206 through a resistor R313, a base terminal coupled to the emitter terminal of transistor Q35 through the resistor network R37, and an emitter terminal coupled to the emitter terminal of the transistor Q35 and to the third bias current source ($I_{bias33}$). In some embodiments, resistors R311 and R313 are replaced by direct connections between the collector terminals of transistors Q35 and Q37 and the differential amplifier circuits 306, 308, respectively.

The asymmetric biasing circuit 208 includes a pair of input terminals 202 and 203, a first differential amplifier circuit 306 formed with transistors Q30 and Q31, a second differential amplifier circuit 308 formed with transistors Q32 and Q33, and a pair of output terminals 314 (Bp) and 315 (Bn). The glitch smoothing circuit 206 is coupled to the first and second differential amplifiers 306, 308. The glitch smoothing circuit 208 reduces common mode glitches caused by switching states of the first and second differential amplifier circuits 306, 308 at the output terminals 303 and 304 of the glitch smooth circuit.

The transistor Q30 has a base terminal coupled to the first laser driver input terminal 202, a collector terminal coupled to a reference voltage source (Vref) through a resistor network R31 and to a first asymmetric biasing output terminal 312 (Pulse), and an emitter terminal coupled to the first output terminal 303 of the glitch smoothing circuit 206. The transistor Q31 has a base terminal coupled to the second laser driver input terminal 203, a collector terminal coupled to the reference voltage source (Vref) through a resistor network R32 and to a second asymmetric biasing output terminal 313 (Plsref) through a third resistor network R33, and an emitter terminal coupled to the emitter terminal of the transistor Q30 and to the first output terminal 303 of the glitch smoothing circuit 206. The transistor Q32 has a base terminal coupled to the second input terminal 203, a collector terminal coupled to the reference voltage source (Vref) through the resistor network R31 and to the first asymmetric biasing output terminal 312 (pulse), and an emitter terminal coupled to a second output terminal 304 of the glitch smoothing circuit 206. The transistor Q33 has a base terminal coupled to the first input terminal 202, a collector terminal coupled to the reference voltage source (Vref) through a fourth resistor network R34 and to the second asymmetric biasing output terminal 313 (Plsref) through a resistor network R35, and an emitter terminal coupled to the emitter terminal of the transistor Q32 and to the second output terminal 304 of the glitch smoothing circuit 206.

Figure 3B:
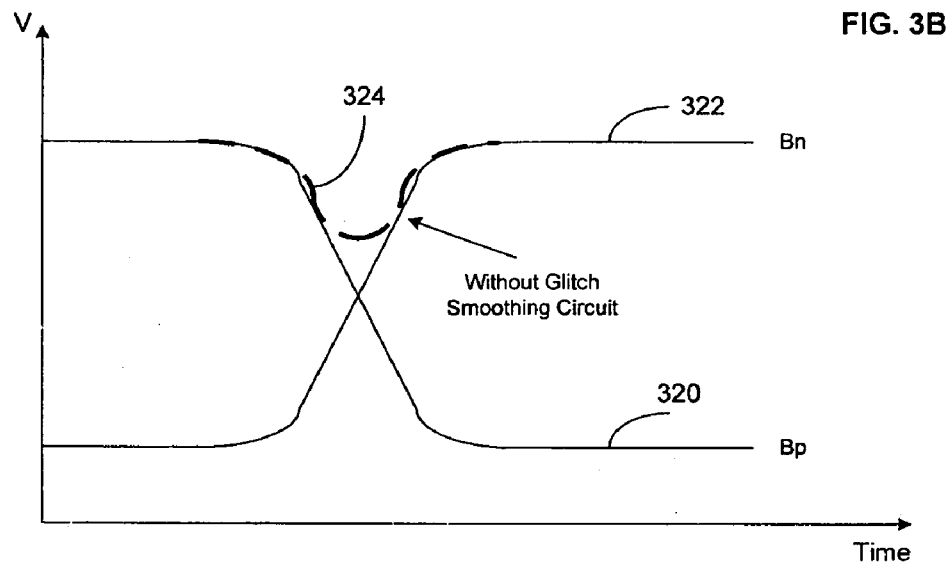
FIG. 3B is a graph of output signals of the differential amplifiers without the glitch smoothing circuit.

FIG. 3B is a graph of output signals of the differential amplifiers 306 and 308 without the glitch smoothing circuit 206 of the present invention. In particular, curve 320 represents a positive bias signal Bp transition and curve 322 represents a negative bias signal Bn transition of the differential amplifiers 306 and 308 respectively. When operating without the glitch smoothing circuit 206, the differential amplifiers 306, 308 are connected to a circuit ground (Vss) through a pair of bias current sources respectively (not shown). For example, as both the positive bias signal Bp and negative bias signal Bn switch states, the first output terminal 303 experiences both the voltage changes from high to low of the Bp signal and from low to high of the Bn signal. The voltage at first output terminal 303 follows the higher voltage signal levels of either the Bp or the Bn signal. In other words, the voltage at the first output terminal 303 follows the Bp signal during the first half of the signal transition as the Bp signal transitions from high to low, and the voltage at the first output terminal 303 follows the Bn signal during the second half of the signal transition as the Bn signal transitions from low to high. Such a transition in voltage signal level at the the first output voltage terminal 303 is represented by the dotted line curve 324. This dip in voltage signal level at the first output voltage terminal 303 creates a common mode glitch each time the first and second differential amplifiers 306 and 308 switch states. And this common mode glitch propagates with the bias signals Bp and Bn.

Figure 3C:
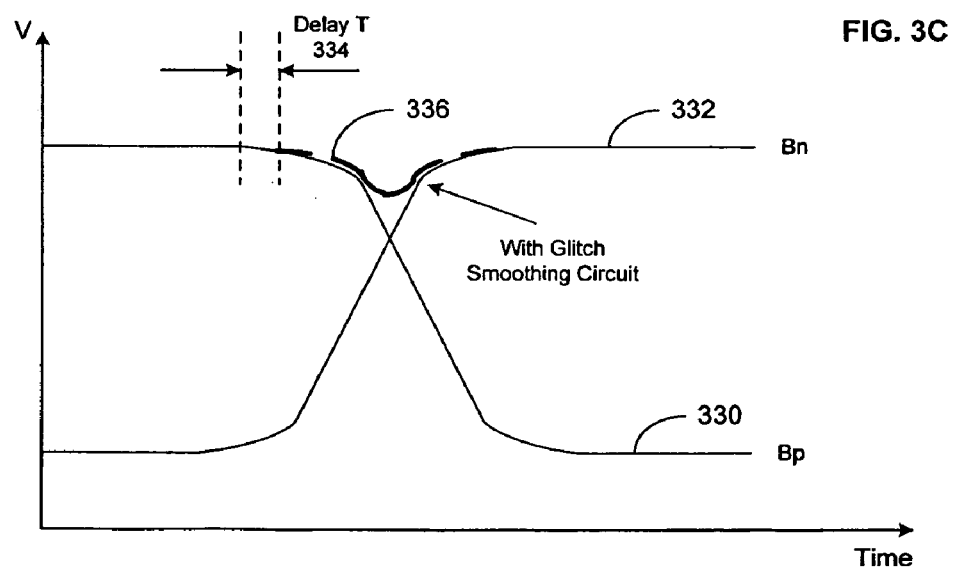
FIG. 3C is a graph of output signals of the differential amplifiers with the glitch smoothing circuit.

FIG. 3C is a graph of output signals of the differential amplifiers 306 and 308 with the glitch smoothing circuit 206. Similar to FIG. 3B, curve 330 represents a positive bias signal Bp at terminal 314 transitioning and curve 332 represents a negative cbias signal (Bn) at terminal 315 transition of the first and second differential amplifier circuits 306 and 308. The first and second differential amplifier circuits 306, 308 are attached to the glitch smoothing circuit 206 at the first and second output terminals 303 and 304 respectively as shown in FIG. 3A.

In one embodiment, the glitch smoothing circuit 206 operates as follows to reduce the common mode glitch created due to state transitions of the differential amplifier circuits 306 and 308. When the laser driver input signal In switches from low to high and Ip switches from high to low, the In signal causes the transistor Q31 and Q32 to turn on and the Ip signal causes the transistors Q30 and Q33 to turn off. If the emitter terminal of Q30 and Q31 is connected to the circuit ground through a bias current source, then the first output terminal 314 would follow the transistor Q31 and be pulled low because the transistor Q31 is turned on. However, with the glitch smoothing circuit 206, even if the transistor Q31 is turned on, the bias signal Bp at the output terminal 314 does not drop until the transistor Q35 is on. The laser driver input signal In to the transistor Q35 is delayed by a resistor network R36 causing the transistor Q35 to turn on with a delay T later, therefore the bias signal Bp starts its transition with a delay T 334 later. Note that the amount of delay in the glitch smoothing circuit controls the amount of glitch reduction on the output signals of the differential amplifier circuits 306 and 308. Meanwhile, the signal Ip transitions from high to low causing the transistor Q33 to turn off, and the second output terminal 315 is pulled high to the reference voltage source (Vref) without a delay. As a result, the voltage at the first output terminal 303 follows the Bp signal during the first half of the signal transition as the Bp signal transitions from high to low, and the voltage at the first output terminal 303 follows the Bn signal during the second half of the signal transition as the Bn signal transitions from low to high. Therefore a reduced common mode glitch is observed at the first output terminal 303 as represented by the dotted line curve 336. Note that the glitch smoothing circuit functions in a similar manner to reduce the common mode glitch when the laser driver input signal (Ip)

transitions from low to high and the laser driver input signal (In) transitions from high to low.

Figure 4A:
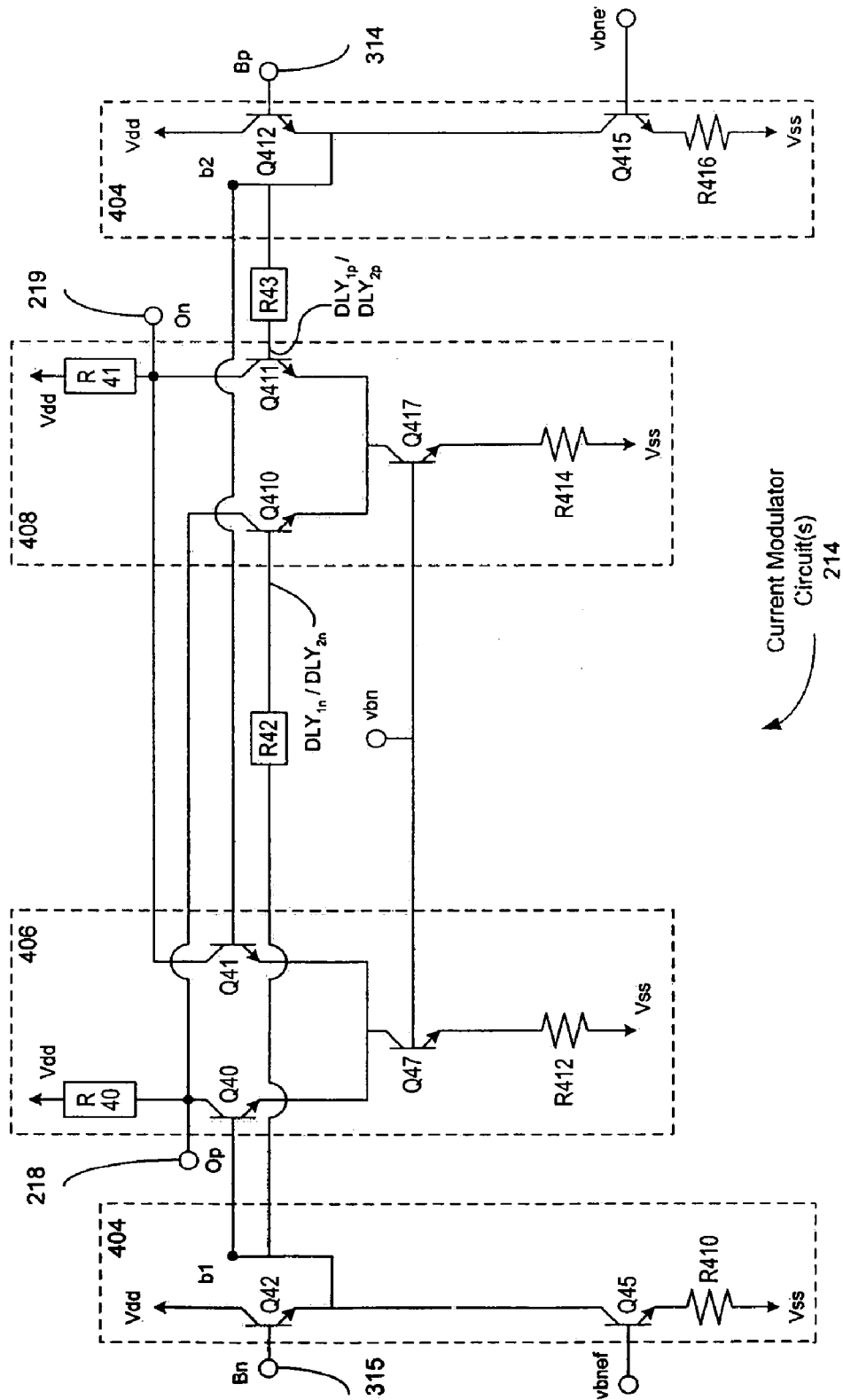
FIG. 4A illustrates an implementation of the current modulator circuit of FIG. 2.

FIG. 4A illustrates an implementation of the current modulator circuit 214 of FIG. 2. The current modulator circuit includes a negative receiver signal path and a positive receiver signal path. One function of the positive and negative receiver signal paths is to isolate the current modulator circuit from the glitch smoothing circuit and other earlier stages of the laser driver circuit. Another function of the positive and negative receiver paths is to set an operating range for modulating the bias signals Bp and Bn on input nodes 314 and 315. The negative receiver signal path includes a transistor Q42, a first bias current source formed with transistor Q45 and resistor R410. The transistor Q42 has a base terminal coupled to node 315 to receive the Bn signal from the asymmetric biasing circuit (FIG. 2), a collector terminal coupled to a power supply (Vdd), and an emitter terminal coupled to the first bias current source (Q45, R410). Similarly, the positive receiver signal path includes a transistor Q412, a second bias current source formed with transistor Q415 and resistor R416. The transistor Q412 has a base terminal coupled to node 314 to receive the Bp signal from the asymmetric biasing circuit (FIG. 2), a collector terminal coupled to the power supply Vdd, and an emitter terminal coupled to the second bias current source (Q415, R416).

The first differential amplifier 406 of FIG. 4A includes transistors Q40 and Q41, a resistor network R40, a bias current source formed with transistor Q47 and resistor R412. The bias current through transistor Q47 is determined by the bias voltage on the base of transistor Q47 and the resistance of resistor R412. The transistor Q40 has a base terminal coupled to a first output port (b1) of the receiver circuit, a collector terminal coupled to the power supply Vdd through a resistor network R40 and to a first output port 218 of the current modulator circuit, and an emitter terminal coupled to the first bias current source (Q47, R412). The transistor Q41 has a base terminal coupled to a second output port (b2) of the receiver circuit, a collector terminal coupled to the power supply Vdd through a resistor network R41 and to a second output port 219 of the current modulator circuit 214, and an emitter terminal coupled to the emitter terminal of the transistor Q40 and to the bias current source (Q47, R412). The resistor networks R40, R41 each include one or more resistors connected in series or in parallel.

The current modulator circuit 214 further includes a resistor network R42 and a resistor network R43. Resistor networks R42 and R43 each include one or more resistors connected in series or in parallel. The resistor network R42 is coupled between the first output port (b1) of the receiver circuit 404, and the first input port of the second differential amplifier circuit 408. The resistor network R42 produces a first predetermined time shift at the first input port of the second differential amplifier circuit 408. Similarly, the resistor network R43 is coupled between the second output port (b2) of the receiver circuit, and the second input port of the second differential amplifier circuit 408. The resistor network R43 produces a second predetermined time shift at the second input port of the second differential amplifier circuit 408. In some embodiments, the first and second predetermined time shifts are approximately the same.

The second differential amplifier 408 of FIGS. 4A includes transistors Q410 and Q411, a resistor network R41, a second bias current source formed with transistor Q417 and resistor R414. The transistor Q410 has a base terminal coupled to receiver output port b1 through resistor network R42, a collector terminal coupled to the power supply Vdd through the resistor network R40 and to the first output port 218 of the current modulator circuit, and an emitter terminal coupled to the second bias current source (Q417, R414). The transistor Q411 has a base terminal coupled to the receiver output port b2 through resistor network R43, a collector terminal coupled to the power supply through the resistor network R1 and to the second output port 219 of the second differential amplifier 408, and an emitter terminal coupled to the emitter terminal of the transistor Q 410 and to the second bias current source (Q17, R14).

As noted above, in some embodiments there are two copies of the circuit 214 shown in FIG. 4A, one of which is sized to drive more current through output nodes 218, 219 than the other. Also, one copy of the circuit 214 produces delay signals DLY1p and DL Y1n, while the other copy produces delay signals DLY2p and DLY2n. These delayed input signals are used as inputs to the transition compensating circuit 210, shown in FIG. 6A.

Figure 4B:
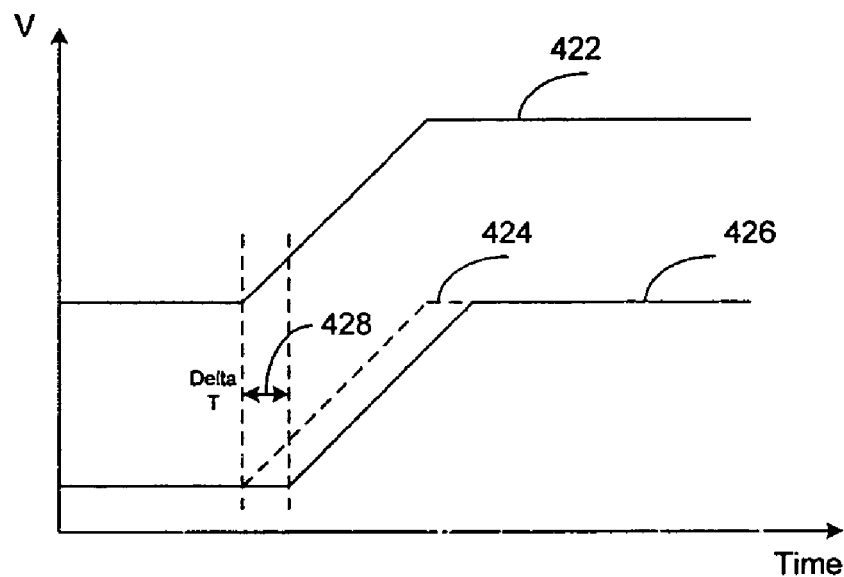
FIG. 4B illustrates output waveforms of the first and second differential amplifiers of FIGS. 4A.

FIG. 4B illustrates output waveforms of the first and second differential amplifiers of FIGS. 4A. Curve 422 represents an output of the first differential amplifier circuit 406. Curve 424, which is a dotted line, represents a corresponding output of the second differential amplifier circuit 408 if the current modulator circuit 214 does not include the resistor networks R42 and R43 (i.e., R42 and R43 are replaced by zero impedance closed circuits). Curve 426 represents a corresponding output of the second differential amplifier circuit 408 when the current modulator circuit 214 includes the resistor networks R42 and R43. Note that the output signal represented by curve 426 is delayed by a predetermined amount of time with respect to the signal represented by curve 424. The time difference between curves 424 and 426 is represented by Delta T 428, which is due to the delay to the input signals of the second differential amplifier circuit 408 produced by the resistor networks R42 and R43.

Figure 4C:
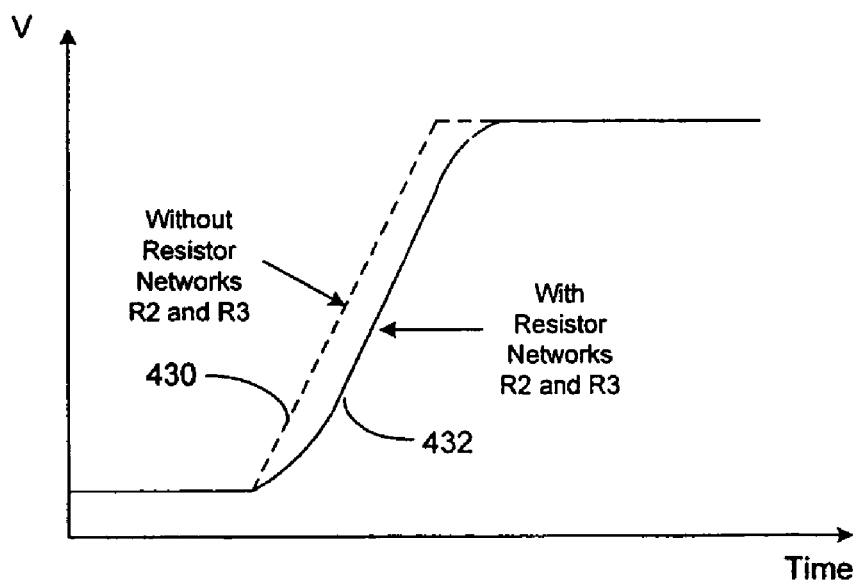
FIG. 4C compares combined output waveforms of the first and second differential amplifiers of FIG. 4A with and without the resistor networks R2 and R3.

FIG. 4C compares combined output waveforms of the first and second differential amplifiers 406 and 408 of FIGS. 4A with and without the resistor networks R42 and R43. Curve 430, which is a dotted line, represents one of the output signals of the current modulator circuit 214 when operating without the resistor networks R42 and R43. The curve 430 represents a sum of the output signals 422 and 424 generated by the first and second differential amplifier circuits 406 and 408, respectively. Although the combined output signal represented by curve 430 is produced by a high amplification gain, this combined signal includes undesired higher order harmonics at the beginning and end of the signal transition due to the simultaneous switching of both the first and second differential amplifiers.

Curve 432 represents one of the output signals of the current modulator circuit when operating with the resistor networks R42 and R43. In one embodiment, at the beginning of a signal transition when the first differential amplifier circuit 406 is on and the second differential amplifier circuit 408 is not yet on due to the delay of the resistor networks R42 and R43, the output signal switches at a rate of the output signal of the first differential amplifier circuit 410 alone. Similarly, at the end of a signal transition when the first differential amplifier circuit 406 is off and the second differential amplifier circuit 408 is still on due to the delay of the resistor networks R42 and R43, the output signal Op, On switches at a rate of transition of the output signal of the second differential amplifier circuit 408 alone. During the period when both the first and second differential amplifier circuits 406, 408 are on, the output signal On, Op switches at a combined rate of the outputs of the first and second differential amplifier circuits 406 and 408. As a result, the combined output signal (represented by curve 432) has fewer undesirable higher order harmonics at the beginning and the end of a signal transition, and therefore the electromagnetic interference generated by the simultaneous switching of the first and second differential amplifiers is reduced.

Figure 5A:
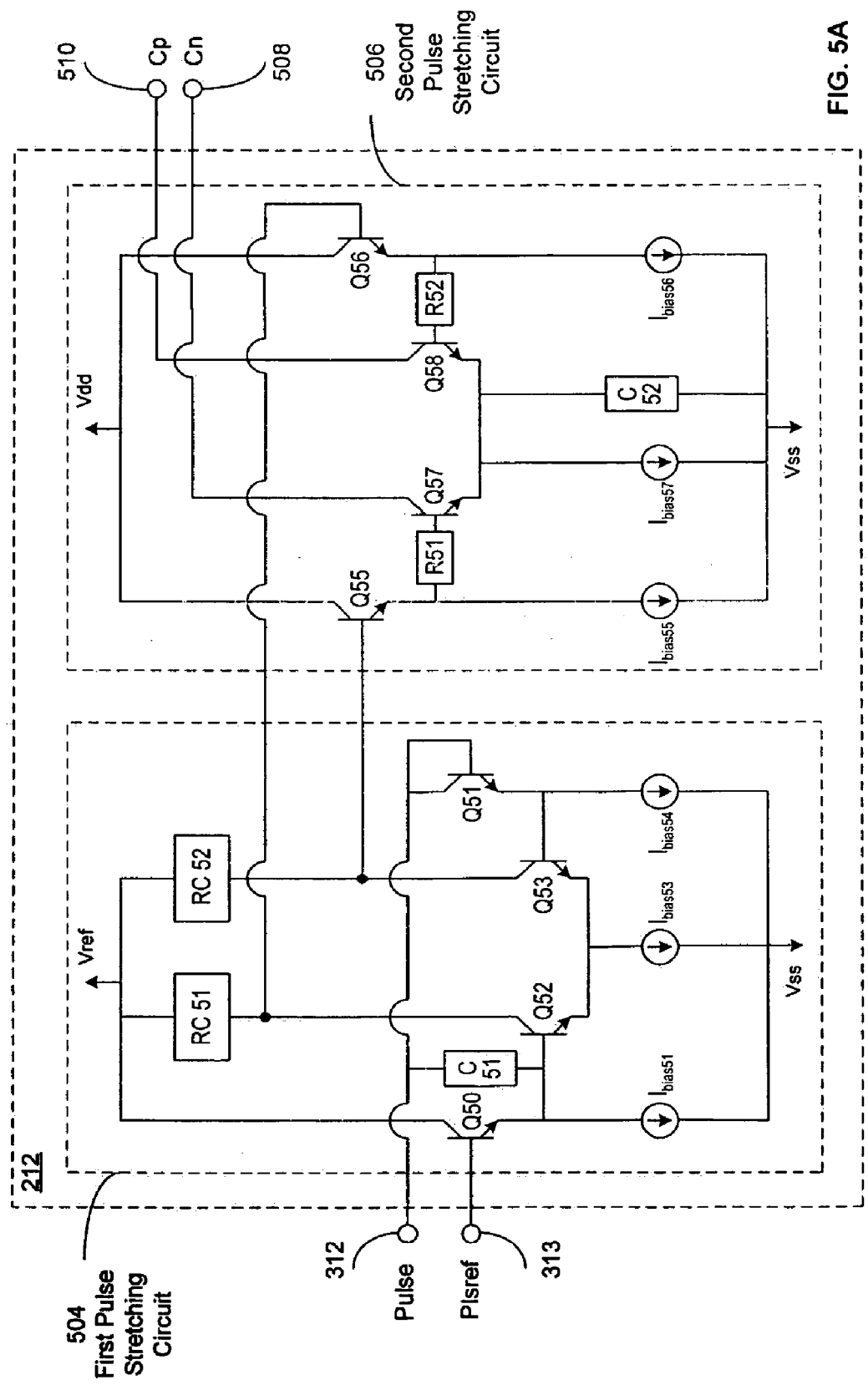
FIG. 5A illustrates an implementation of the pulse shaping circuit of FIG. 2.

FIG. 5A illustrates an implementation of the pulse shaping circuit 212 of FIG. 2. The pulse shaping circuit 212 may include one or more pulse stretching circuits. In one embodiment, the pulse shaping circuit 212 is coupled to node 312 (Pulse) and node 313 (Plsref). The pulse shaping circuit includes a first pulse stretching circuit 504, a second pulse stretching circuit 506, a first output terminal 508 and a second output terminal 510. The first pulse stretching circuit 504 is connected in series with the second pulse stretching circuit 506. The first and second input nodes 312, 313 are configured to receive an asymmetric pulse and an asymmetric reference pulse signals generated by the asymmetric biasing circuit 208 (see nodes 312, 313 in FIG. 3A). The first pulse stretching circuit 504 increases the amplitude and expands the bandwidth of the asymmetric pulse signal. The second pulse stretching circuit 66 further increases the amplitude and expands the bandwidth of the asymmetric pulse signal. The first and second output terminals 508, 510 are configured to drive a pair of pulse shaping output signals.

The first pulse stretching circuit 504 includes a buffer circuit formed with transistors Q50 and Q51 and their corresponding bias current sources $I_{bias51}$ and $I_{bias52}$, and a differential amplifier formed with transistors Q52 and Q53 as shown in FIG. 5A. The transistor Q50 has a base terminal coupled to a second output terminal (313, FIG. 3A) of the asymmetric biasing circuit, a collector terminal coupled to a reference voltage source (Vref), and an emitter terminal coupled to a circuit ground (Vss) through the bias current source $I_{bias51}$. The transistor Q51 has a base terminal coupled to a first output node (312, FIG. 3A) of the asymmetric biasing circuit, a collector terminal coupled to the base terminal of the transistor Q51 and to the emitter terminal of the transistor Q50 through a capacitor network C51, and an emitter terminal coupled to the circuit ground through the bias current source $I_{bias52}$. The transistor Q52 has a base terminal coupled to the emitter terminal of transistor Q50, a collector terminal coupled to the reference voltage source Vdd through a resistor and capacitor network RC5 1 and to a first output terminal of the first pulse stretching circuit 504, and an emitter coupled to the circuit ground through a bias current source $I_{bias53}$. The transistor Q53 has a base terminal coupled to the emitter terminal of transistor Q51, a collector terminal coupled to the reference voltage source Vdd through a resistor and capacitor network RC52 and to a second output terminal of the first pulse stretching circuit 504, and an emitter terminal coupled to the emitter terminal of the transistor Q52 and to the circuit ground through the bias current source $I_{bias53}$. The first pulse stretching circuit 504 shapes the input pulse signals Pulse and Plsref as follows. First, it delays the switching of the input signals Pulse and Plsref with the capacitor network C51. Then, it amplifies the input signals Pulse and Plsref to a predetermined signal level with the differential amplifier circuit (Q52, Q53). Finally, the output signals at the output terminals of the first pulse stretching circuit are delayed by the resistor-capacitor networks RC51 and RC52.

The second pulse stretching circuit 506 includes a second buffer circuit founded with transistors Q55 and Q56 and their corresponding bias current sources $I_{bias55}$ and $I_{bias56}$. The second pulse stretching circuit further includes a differential amplifier circuit formed with transistors Q57 and Q58. The transistor Q55 has a base terminal coupled to the second output terminal of the first pulse stretching circuit, a collector terminal coupled to a power supply source Vdd, and an emitter terminal coupled to a circuit ground Vss through the bias current source $I_{bias55}$. The transistor Q56 has a base terminal coupled to the first output terminal of the first pulse stretching circuit, a collector terminal coupled to the power supply source Vdd, and an emitter terminal coupled to the circuit ground through the bias current source $I_{bias56}$. The transistor Q57 has a base terminal coupled to the emitter terminal of the transistor Q55 through a resistor network R51, a collector terminal coupled to a first output terminal 508 of the second pulse stretching circuit, and an emitter terminal coupled the circuit ground through a bias current source $I_{bias57}$ and through a capacitor network C52. The transistor Q58 has a base terminal coupled to the emitter terminal of the transistor Q56 through a resistor network R52, a collector terminal coupled to a secondoutput terminal 510 of the second pulse stretching circuit, and an emitter terminal coupled to the emitter terminal of the transistor Q57 and to the capacitor network C52. The second pulse stretching circuit 506 further shapes the output signals from the first pulse stretching circuit 504 as follows. First, the input signals from the first pulse stretching circuit 504 are delayed by the resistor networks R51 and R52. Next, the second pulse stretching circuit 506 amplifies the input signals to a predetermined signal level with the differential amplifier circuit (Q57, Q58). Finally, the switching of the output signals is delayed by the capacitor network C52 attached between the differential amplifier circuit (Q7, Q5) and the circuit ground Vss.

The supply voltage Vdd used by the second pulse stretching circuit 506 is typically larger than the reference voltage Vref used by the first pulse stretching circuit 504, thereby enabling the second pulse stretching circuit 506 to perform greater amplification than the first pulse stretching circuit 504. Furthermore, the reference voltage Vref is the same voltage throughout the various circuits shown in the Figures. In some embodiments, Vdd is a voltage between about 2.9 and about 3.6 volts, and Vref is a regulated voltage that is approximately 2.7 volts. The voltage of Vref is approximately constant for the full range of Vdd voltages.

Figure 5B:
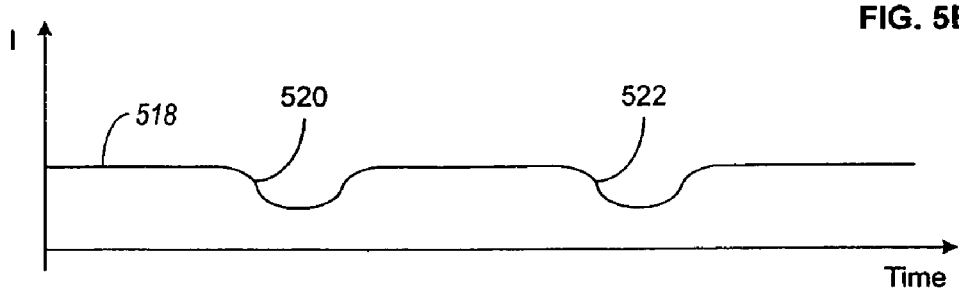
FIG. 5B illustrates an output waveform of the pulse shaping circuit of FIG. 2.

FIG. 5B illustrates an output waveform (Cn) of the pulse shaping circuit 212 of FIG. 2 and FIG. 5A. More particularly, the output waveform Cn shown in FIG. 5B represents current flowing from node 508 into the pulse shaping circuit of FIG. 5A. The waveform Cn comprises a pulse in the downward direction at each signal transition at the input terminals 202, 203 of the laser driver circuit 106, for example pulses 520 and 522 represent such signal transitions of the pair of differential laser driver input signals Ip, In of the laser driver circuit 106. Each pulse 520, 522 is asymmetrically biased by the asymmetric biasing circuit 208 to provide a wider range of signal modulation for a high to low signal transition than for a low to high signal transition of the laser driver output signal. In addition, the magnitude of each pulse 520, 522 has been amplified and the bandwidth of each pulse has been expanded by the pulse shaping circuit 206. The output waveform of the pulse shaping circuit 212 and the output waveform of the transition compensating circuit 210 form the output waveform of the transition boost circuit 204 Cp, Cn. The output waveform of the Cn, Cp transition boost circuit 204 is used to enhance the output waveform of the Op, On current modulator circuit 214. The resulting enhanced waveform is processed by the nonlinear integrator circuit 216, which is described below in association with FIGS. 7A, 7B and 7*c*.

Figure 6B:
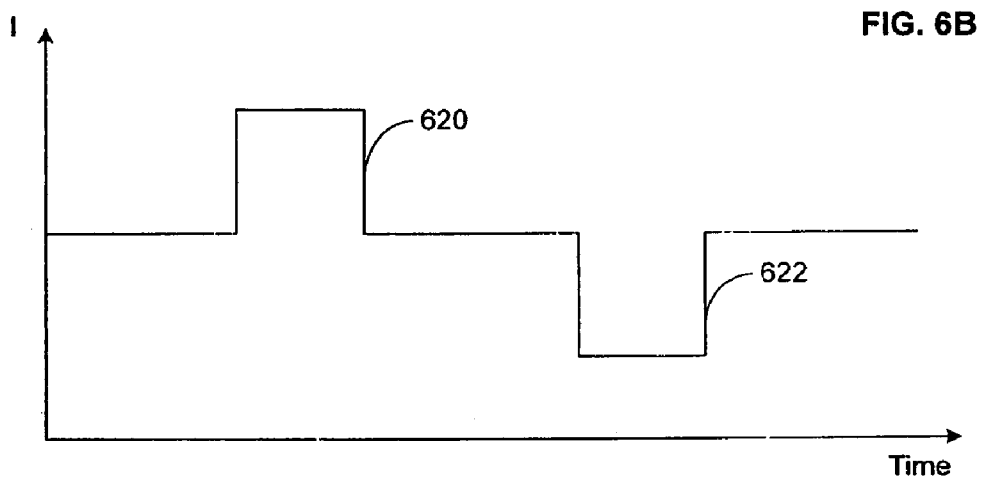
FIG. 6B is a transition compensating output signal of the transition compensating circuit of FIG. 6A.
Figure 6C:
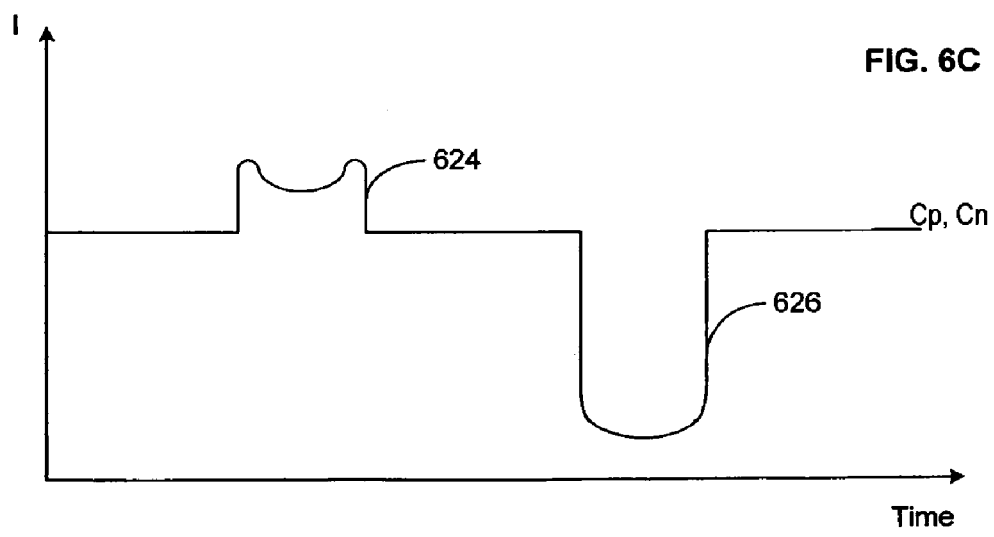
FIG. 6C is an output waveform of the transition boost circuit of FIG. 2.
Figure 6A:
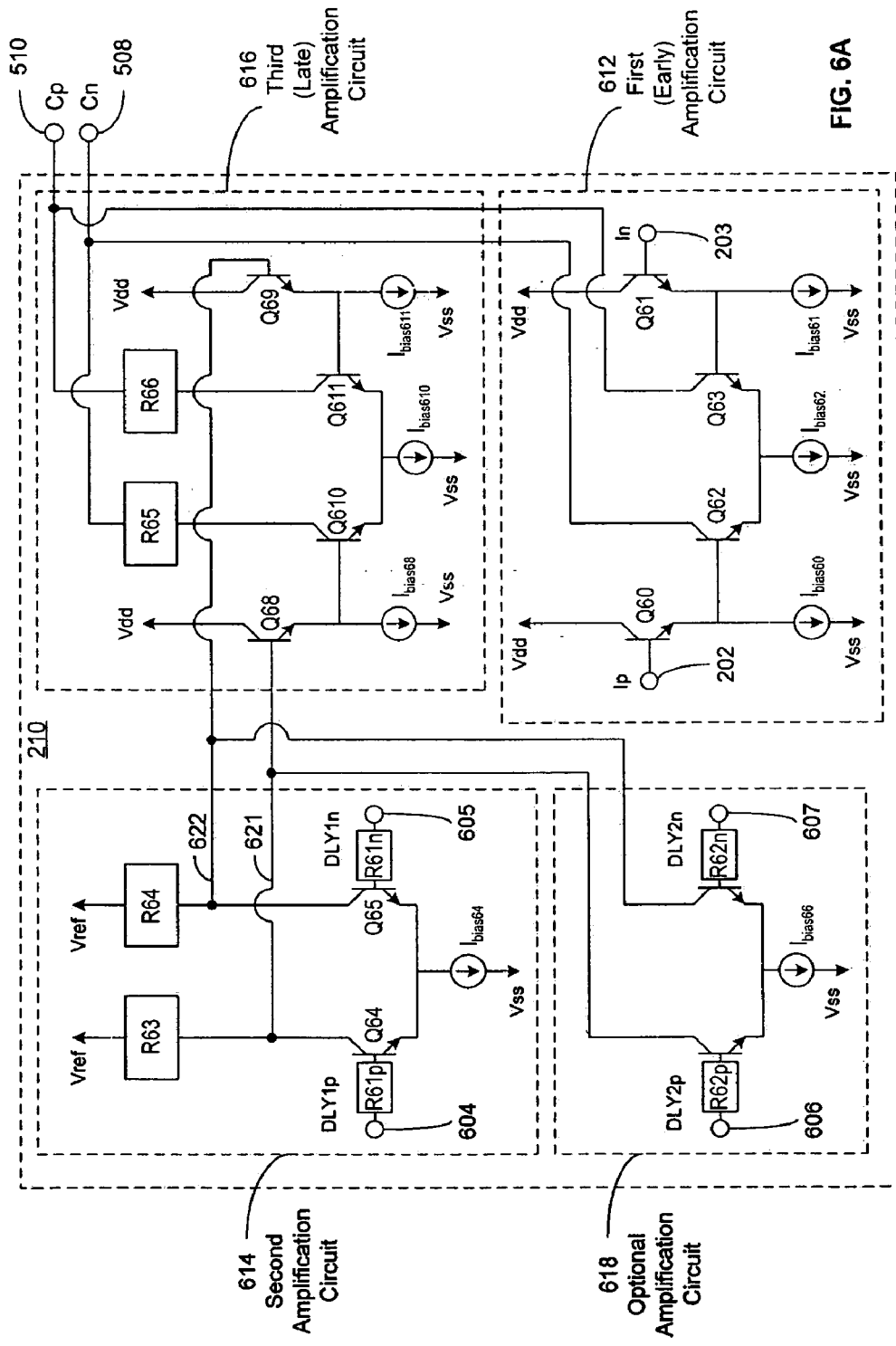
FIG. 6A illustrates an implementation of the transition compensating circuit of FIG. 2.

FIG. 6A illustrates an implementation of the transition compensating circuit 210 of FIG. 2. The transition compensating circuit 210 is coupled to laser driver input terminals 202 and 203, and also includes a second pair of input terminals 604 and 605, an optional pair of input terminals 606 and 607, a first amplification circuit 612, a second amplification circuit 614, a third amplification circuit 616 and an optional fourth amplification circuit 618. The first amplification circuit 612 is configured to receive the pair of differential laser driver input signals (Ip, In) and to generate a pair of transition compensating signals in response to the input signals Ip, In. The second amplification circuit 614 is configured to receive a first delayed version of the pair of differential laser driver input signals (DLY1p, DLY1n) at the input terminals 604 and 605 respectively, and the third amplification circuit 616 is configured to receive the output signals of the second amplification circuit 614. The second and third amplification circuits 614, 616 generate a pair of delayed and inverted transition compensating signals for canceling the pair of transition compensating signals of the first amplification circuit.

The optional fourth amplification circuit 618 is configured to receive a second delayed version of the pair of differential laser driver input signals (DLY2p, DLY2n) at the input terminals 606 and 607. The fourth amplification circuit 618 is included only in embodiments in which two current modulator circuits 214 are provided. Furthermore, in some embodiments, only one of the circuits 614 or 618 is enabled, for instance by enabling only one of the bias currents $I_{bias64}$ and $I_{bias66}$. Thus, even though the output terminals of the optional fourth amplification circuit 618 are coupled in parallel to the output terminals of the second amplification circuit 614, only one of the circuits 614 or 618 is used to trigger the third amplification circuit 616. Since circuits 614 and 618 are driven by the delayed input signals, (DLY1p, DLY1n) and (DLY2p, DLY2n), the triggering of the third amplification circuit 616 is delayed (with respect to laser driver input signals Ip, In) by an amount corresponding to the delay in those delayed input signals plus the delay associated with circuit 614 or 618.

The transition compensating circuit 210 further includes a first output terminal 508 and a second output terminal 510 The first output terminal is configured to combine a first transition compensating output signal of the first amplification circuit 612 and a corresponding first delayed and inverted transition compensating output signal of the second and third amplification circuits 614, 616 to form a first transition compensating pulse signal. The second output terminal is configured to combine a second transition compensating output signal of the first amplification circuit 612 and a corresponding second delayed and inverted transition compensating output signal of the second and third amplification circuits 614, 616 to form a second transition compensating pulse signal. A combined waveform of the first amplification circuit 612 and the third amplification circuit 616 is shown and described in association with FIG. 6B below.

The first amplification circuit 612 includes a first buffer circuit formed with transistors Q60 and Q61. The transistor Q60 has a base terminal coupled to the input terminal 202, a collector terminal coupled to a power supply voltage source Vdd, and an emitter terminal coupled to a circuit ground Vss through a bias current source $I_{bias61}$. The transistor Q61 has a base terminal coupled to the input terminal 203 In, a collector terminal coupled to the power supply voltage source, and an emitter terminal coupled to the circuit ground through a bias current source $I_{bias61}$. The first amplification circuit 612 further includes a differential amplifier circuit formed with transistors Q62 and Q63. The transistor Q2 has a base terminal coupled to the emitter terminal of the transistor Q60, a collector terminal coupled to a first output terminal 508 of the first amplification circuit, and an emitter terminal coupled to the circuit ground through a bias current source $I_{bias66}$. The transistor Q63 has a base terminal coupled to the emitter terminal of the transistor Q61, a collector terminal coupled to a second output terminal 510 of the first amplification circuit, and an emitter terminal coupled to the emitter terminal of the transistor Q62 and to the bias current source $I_{bias62}$.

The second amplification circuit 614 includes a pair of resistor networks R61p and R61n coupled to the input terminals 604 and 605 respectively. The second amplification circuit 614 further includes a differential amplifier circuit formed with, transistors Q64 and Q65. The transistor Q64 has a base terminal coupled to the input terminal 604 through the resistor network R61p, a collector terminal coupled to a reference voltage source Vref through a resistor network R63 and coupled to a first output terminal 621 of the second amplification circuit, and an emitter terminal coupled to a circuit ground (Vss) through a bias current source $I_{bias64}$. The transistor Q65 has a base terminal coupled to the input terminal 605 through the resistor network R61n, a collector terminal coupled to the reference voltage source Vref through a resistor network R64 and coupled to a second output terminal 622 of the second amplification circuit, and an emitter terminal coupled to the emitter terminal of the transistor Q64 and to the bias current source $I_{bias64}$. The resistor networks R61p, R61n, R63 and R64 include one or more resistors connected in series or in parallel.

The optional amplification circuit 618 is similar to the second amplification circuit 614. The optional amplification circuit 618 includes a pair of resistor networks R62p and R62n coupled to the input terminals 606 and 607 respectively. The optional amplification circuit 618 further includes a differential amplifier circuit formed with transistors Q66 and Q67. The transistor Q66 has a base terminal coupled to the input terminal 606 through the resistor network R62p, a collector terminal coupled to the reference voltage source through the resistor network R63 and coupled to the first output terminal 621 of the second amplification circuit 614, and an emitter terminal coupled to the circuit ground Vss through a bias current source $I_{bias66}$. The transistor Q67 has a base terminal coupled to the input terminal 607 through the resistor network R62n, a collector terminal coupled to the reference voltage source Vref through the resistor network R64 and coupled to the second output terminal 622 of the second amplification circuit 614, and an emitter terminal coupled to the emitter terminal of the transistor Q66 and to the bias current source $I_{bias66}$. The resistor networks R62p and R62n include one or more resistors connected in series or in parallel.

The third amplification circuit 616 includes a buffer circuit formed with transistors Q68 and Q69. The transistor Q68 has a base terminal coupled to the first output terminal 621 of the second amplification circuit 614, a collector terminal coupled to a power supply voltage source Vdd, and an emitter terminal coupled to a circuit ground Vss through a bias current source $I_{bias68}$. The transistor Q69 has a base terminal coupled to the second output terminal 622 of the second amplification circuit 614, a collector terminal coupled to the power supply voltage source Vcc, and an emitter terminal coupled to the circuit ground Vss through a bias current source $I_{bias69}$. The third amplification circuit 616 further includes a differential amplifier circuit formed with transistors Q610 and Q611. The transistor Q610 has a base terminal coupled to the emitter terminal of the transistor Q68, a collector terminal coupled to a first output terminal 508 of the third amplification circuit 616 through a resistor network R65, an emitter terminal coupled to the circuit ground through a bias current source $I_{bias610}$. The transistor Q611 has a base terminal coupled to the emitter terminal of the transistor Q69, a collector terminal coupled to a second output terminal 510 of the third amplification circuit 616 through a resistor network R66, and an emitter terminal coupled to the emitter terminal of the transistor Q610 and to the bias current source $I_{bias610}$. The resistor networks R65 and R66 include one or more resistors connected in series or in parallel.

FIG. 6B is a diagram depicting a transition compensating output signal of the transition compensating circuit 210 of FIG. 6A. According to an embodiment of the present invention, the first amplification circuit 612 operates as follows. When the laser driver input signal Ip at laser driver input terminal 202 transitions from low to high and the laser driver input signal In at laser driver input terminal 203 transitions from high to low, the transistor Q60 turns on by the laser driver input signal Ip and the transistor Q61 turns off by the laser driver input signal In. As a result, the base terminal of the transistor Q62 is pulled high, thus turns on transistor Q62; and the base terminal of the transistor Q63 is pulled low by the bias current source $I_{bias62}$. When transistor Q62 is on, the bias current pulls the output terminal 508 low, thus causing the transition compensating signal at terminal 508 to transition from high to low. When transistor Q63 is off, the output terminal 510 is pulled high (by diode 708 of the Nonlinear Integrator Circuit 216, FIG. 7A), thus causing the transition-compensating signal at terminal 510 to transition from low to high.

The second and third amplification circuits 614, 616 operate as follows. When the laser driver input signal Ip transitions from low to high, the laser driver input signal In transitions from high to low. After a predetermined amount of delay, the input signals (DLY1p and DLY1n) at the input terminals 604 and 605 of the second amplification circuit 614 behave as follows. The input signal (DLY1p) transitions from low to high and the input signal (DLY1n) transitions from high to low. The signal (DLY1p) causes the transistor Q64 to turn on and the signal (DLY1n) signal causes the transistor Q65 to turn off. As a result, the base terminal of the transistor Q68 is pulled low by the bias current source $I_{bias64}$, which turns off transistor Q68; and the base terminal of the transistor Q69 is pulled high, which turns on transistor Q69. When transistor Q68 is off, the bias current source $I_{bias8}$ pulls the base terminal of transistor Q610 low causing transistor Q610 to turn off. On the other hand, when transistor Q69 is on, the base terminal of transistor Q611 is pulled high, causing transistor Q611 to turn on. Therefore, when transistor Q610 is off, the output terminal 508 is pulled high (by diode 706 of the Nonlinear Integrating Circuit 216 (FIG. 7A), thus causing the output terminal 508 to transition from low to high. When transistor Q611 is on, the output terminal 510 is pulled low, thus causing the output terminal 510 to transition from high to low.

At the output terminals 508 and 510, the output signals of the first amplification circuit 612 and the third amplification circuit 616 are tied together. Hence, when the laser driver input signal Ip transitions from low to high, and the laser driver input signal In transitions from high to low, the first amplification circuit 612 releases the output signal at the output terminal 510, enabling it to be pulled from low to high by diode 708 (FIG. 7A), and after a predetermined period of time, the third amplification circuit 616 pulls the output signal at the output terminal 510 from high back to low, thus creating a first pulse 620 in the positive direction as shown in FIG. 6B. On the other hand, when the laser driver input signal Ip transitions from low to high, and the laser driver input signal In transitions from high to low, the first amplification circuit 612 pulls the output signal at the output terminal 508 from high to low, and after a predetermined period of time, the third amplification circuit 616 stops drawing current from the output terminal 508, allowing the output terminal 508 to transition back to a higher voltage, thus creating a pulse in the negative direction on the output terminal 508 (not shown). Note that in the reverse direction, when the laser driver input signal Ip transitions from high to low and the laser driver input signal In transitions from low to high, a pulse in the negative direction is created at the output terminal 510 as a second pulse 622 as shown in FIG. 6B, and a pulse in the positive direction is created at the output terminal 508 (not shown).

FIG. 6C is an output waveform Cp, Cn of the transition boost circuit 204. The output waveform combines the corresponding output signals of the transition compensating circuit 210 and the pulse shaping circuit 212 of FIG. 6A and FIG. 5A respectively. In particular, a pulse signal 624 is a combination of the pulse signal 520 of FIG. 5B and the pulse signal 620 of FIG. 6B; and a pulse signal 626 is a combination of the pulse signal 522 of FIG. 5B and the pulse signal 622 of FIG. 6B. Note that the combined pulse signals 624 and 626 provide a larger range of modulation of the laser driver output signal in the negative direction (for turning off the laser diode) than in the positive direction (for turning on the laser diode).

Figure 7A:
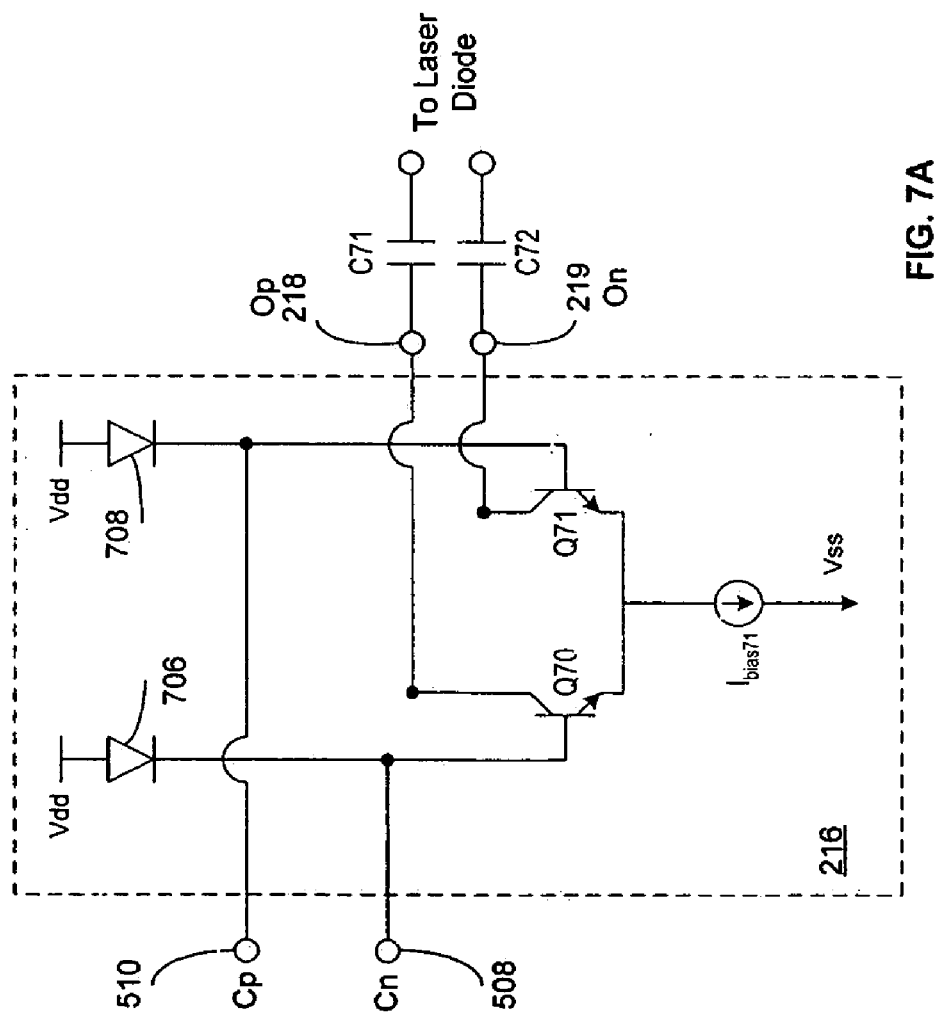
FIG. 7A illustrates an implementation of the nonlinear integrator circuit of FIG. 2.

FIG. 7A illustrates an implementation of the nonlinear integrator circuit 216 of FIG. 2. The nonlinear integrator circuit 216 is coupled to output terminals 508 and 510 and includes a first diode 706, a second diode 708, a differential amplifier circuit formed with transistors Q0 and Q1, and a pair of output terminals 218 and 219. The first input terminal, at node 508, is configured to receive the corresponding first (input signals from the pulse shaping circuit 212 and the transition compensating circuit 210 (FIG. 2A), and the second input terminal, at node 510, is configured to receive corresponding second input signals from the pulse shaping circuit and the transition compensating circuit.

The first and second diodes 706 and 708 function as nonlinear integrators that perform nonlinear modulation on the input signals received. The first diode 706 is coupled between a power supply voltage source Vdd and the node 508. The first diode 706 is configured to integrate input signals received from corresponding output node 508 of the pulse shaping circuit 212 and the transition compensating circuit 210. The second diode 708 is coupled between the power supply voltage source Vdd and the second node 510. Similarly, the second diode 708 is configured to integrate input signals received from the node 510 of the pulse shaping circuit 212 and the transition compensating circuit 210. The transistor Q70 has a base terminal coupled to the first input terminal 508, a collector terminal coupled to the first laser driver output terminal 218 of the nonlinear integrator circuit 216, and an emitter terminal coupled to a circuit ground (Vss) through a bias current source $I_{bias71}$. The transistor Q71 has a base terminal coupled to the second input terminal 510, a collector terminal coupled to a second laser driver output terminal 219 of the nonlinear integrator circuit 216, and an emitter terminal coupled to the emitter terminal of the transistor Q70 and to the bias current source $I_{bias71}$. The first and second laser driver output terminals 218 and 219 are capacitively coupled (also called AC coupled) to the laser diode 108 through a pair of capacitors C71 and C72 and a pair of transmission lines. These laser driver output terminals 218 and 219 are also coupled to the current modulator circuit(s) 214, which include output pull-up resistor networks R70 and R71 (see FIG. 4A).

Figure 7B:
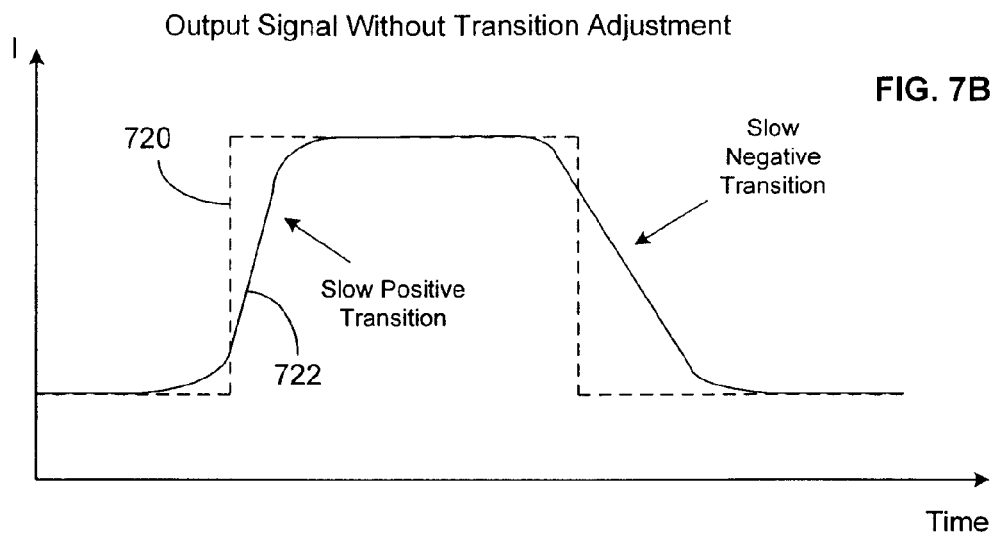
FIG. 7B is a graph of an output signal of a laser driver circuit without applying the technique of the transition boost circuit.
Figure 7C:
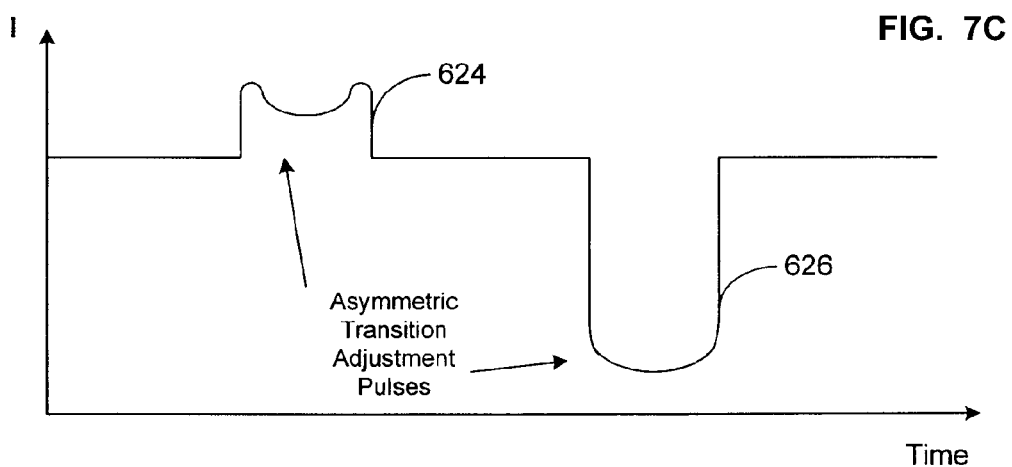
FIG. 7C is an output waveform of the transition boost circuit of FIG. 2, denoting the asymmetric transition adjustment pulses.

FIG. 7B is a graph of an output signal of a laser driver circuit without applying the technique of the transition boost circuit 204. The dotted line represents an ideal square wave form 720. The curve 722, which is a solid line, represents an output signal of the laser driver circuit without the transition boost circuit 204. Note that both the positive and negative signal transitions deviate from the ideal square wave form 720, especially for a signal transition from high to low. As inherent with a conventional laser driver circuit, it takes longer to discharge the current modulator circuit, in order to turn off an output signal that drives the laser diode, than it takes to turn on the same output signal.

Figure 7D:
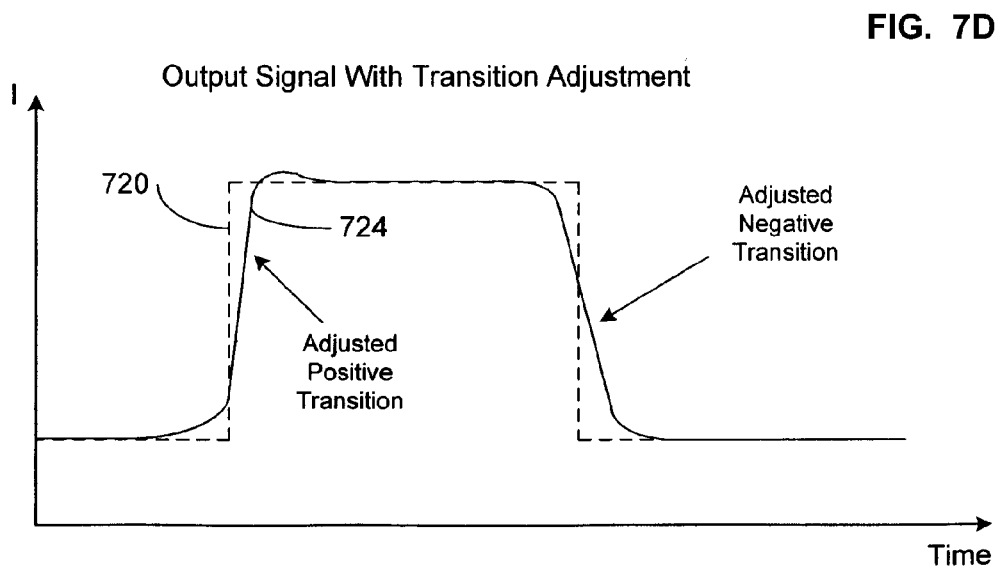
FIG. 7D is an output signal of the imprived laser driver circuit with applying the transition boost circuit.

FIG. 7D is a graph of an output signal of the improved laser driver circuit in which the transition boost circuit is applied to the input of the nonlinear integrator circuit 216. Similar to FIG. 7B, the dotted line represents an ideal square wave form 720. Curve 724, shown as the solid line, represents the output signal of the laser driver circuit with the transition boosting circuit 204. As shown in FIG. 7D, the low to high signal transition is enhanced towards the ideal square waveform 720 and the performance of the positive signal transition is improved. This improvement is due to the asymmetric transition adjustment pulse 624 of FIG. 6C (also shown in FIG. 7C) being applied to the positive transition of the output signals of the current modulator circuit 214. Similarly, the high to low signal transition is enhanced towards the ideal square waveform 720 and the performance of negative signal transition is also improved. This improvement is due to the asymmetric transition adjustment pulse 626 of FIG. 6C (also shown in FIG. 7C) being applied to the negative transition of the output signals of the current modulator circuit 214.

One skilled in the relevant art will recognize that there are many possible modifications of the disclosed embodiments that could be used, while still employing the same basic underlying mechanisms and methodologies. For example, different types of transistors, such as FET or MOS transistors, may be used to implement the amplification circuit. Thus, the terms "base," "collector" and "emitter" used in the foregoing descriptions would correspond to "gate," "source" and "drain" in some other embodiments. One or more amplification stages may be used to implement the transition boost circuit. One or more pairs of differential amplifiers may be used to implement the current modulator circuit to drive the pair of current output signals to the laser diode.

Some embodiments of the invention may be described in functional language including references to means that perform a particular function. For example, one embodiment includes means for generating a transition boost signal to enhance a digital modulated signal. The structure corresponding to the means for generating a transition boost signal may include, for example, the transition boost circuit 204 shown in FIG. 2. The means for generating a transition boost signal may include means for generating a transition compensating signal. The transition compensating signal is configured to enhance transitions of the digital modulated signal. The structure corresponding to the means for generating a transition compensating signal may include, for example, the transition compensating circuit 210 shown in FIG. 2. The means for generating a transition boost signal may also include means for generating a pulse shaping output signal. The pulse shaping output signal includes pulses at transitions of the digital modulated signal. The structure corresponding to the means for generating a pulse shaping output signal may include, for example, the pulse shaping circuit 212 shown in FIG. 2. The means for generating a transition boost signal may further include means for combining the transition compensating signal and the pulse shaping output signal to form the transition boost signal. The structure corresponding to the means for combining the transition compensating signal and the pulse shaping output signal may include, for example, various traces, connectors, and/or the nonlinear integrator circuit 216 shown in FIG. 2.

Embodiments may include means for generating an output signal including the digital modulated signal and the transition boost signal. The structure corresponding to the means for generating an output signal may include, for example, elements of the current modulator circuit 214 and/or the nonlinear integrator circuit 216 shown in FIG. 2.

In one embodiment, the means for generating a pulse shaping output signal comprise means for generating pulses. The structure corresponding to the means for generating pulses may include the asymmetric biasing circuit 208 shown in FIG. 2.

In one embodiment, the means for generating a pulse shaping output signal comprises means for adjusting the width of a pulse. The structure corresponding to the means for adjusting the width of a pulse may include circuits such as the pulse stretching circuits 504 and 506 shown in FIG. 5A. In some embodiments, the means for adjusting the width of a pulse may include means for delaying a transition. The structure corresponding to the means for delaying a transition may include for example, RC51 and/or RC52 shown in FIG. 5A. The means for generating a pulse shaping output signal may also include means for adjusting the amplitude of a pulse.

Embodiments may further include means for smoothing glitches caused by simultaneous transitions of high to low and low to high in a differential amplifier pair. The structure corresponding to the means for smoothing glitches may include, for example, the glitch smoothing circuit 206 shown in FIG. 2 and FIG. 3A. The means for smoothing glitches may include means for delaying one of the transitions from high, to low or low to high. The structure corresponding to the means for delaying may include elements such as resistor networks R6 and R7 and capacitance from transistors Q34 and Q36.

The foregoing description, for purpose of explanation, has been described with reference to specific embodiments. However, the illustrative discussions above are not intended to be exhaustive or to limit the invention to the precise forms disclosed. Many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes that come within the meaning and range of equivalency of the claims are to be embraced within their scope.

What is claimed is:

1. A laser driver circuit, comprising:
   a pair of laser driver input terminals configured to receive a pair of differential input signals;
   a current modulator circuit configured to generate a pair of current modulator output signals in accordance with the pair of differential input signals;
   a transition boost circuit configured to generate a pair of transition boost signals for enhancing signal transitions of the pair of current modulator output signals, wherein the pair of transition boost output signals are generated in accordance with the pair of differential input signals; and
   a nonlinear integrator circuit coupled to the transition boost circuit, wherein the nonlinear integrator circuit is configured to integrate the pair of transition boost signals to generate a pair of differential current output signals.

2. The laser driver circuit of claim 1, further including a pair of laser driver output terminals configured to combine the pair of differential current output signals and the pair of current modulator output signals to produce a pair of combined signals for transmission to a laser diode.

3. The laser driver circuit of claim 1, wherein the laser driver circuit is coupled to receive the differential pair of input signals from a digital interface circuit, and wherein the laser driver circuit is configured to drive the pair of current modulator output signals to a laser diode.

4. The laser driver circuit of claim 1, wherein the transition boost circuit comprises:
   a pair of input terminals coupled to the pair of laser driver input terminals;
   an asymmetric biasing circuit configured to generate an asymmetric pulse signal and an asymmetric reference pulse signal at each signal transition of the current modulator circuit in accordance with the pair of differential input signals, wherein the asymmetric pulse signal and the asymmetric reference pulse signal are biased to provide a larger signal adjustment for a negative signal transition than a positive signal transition of the current modulator output signals;
   a pulse shaping circuit configured to adjust amplitude and bandwidth of the asymmetric pulse signal to generate a pair of pulse shaping output signals, wherein the pulse shaping circuit comprises one or more pulse amplification and stretching circuits;
   a transition compensating circuit configured to generate a pair of transition compensating signals in accordance with the pair of differential input signals, wherein the pair of transition compensating signals comprises a positive compensating pulse at each positive transition and a negative compensating pulse at each negative transition of the current modulator output signals, and wherein the positive and negative compensating pulses provide enhancements to the pair of current modulator output signals; and
   a first output terminal and a second output terminal, wherein the first output terminal is configured to combine a first pulse shaping output signal with a corresponding first transition compensating signal to generate a first transition boost output signal, and wherein the second output terminal is configured to combine a second pulse shaping output signal with a corresponding second transition compensating signal to generate a second transition boost output signal.

5. The laser driver circuit of claim 4, wherein the asymmetric biasing circuit comprises:
   a first differential, amplifier and a second differential amplifier, wherein the first and second differential amplifier are configured to generate the asymmetric pulse signal and the asymmetric reference pulse signal; and
   a glitch smoothing circuit coupled to the first and second differential amplifiers, wherein the glitch smoothing circuit is configured to reduce signal glitches caused by switching states of the first and second differential amplifiers.

6. The laser driver circuit of claim 4, wherein the pulse shaping circuit comprises:
   a first input terminal and a second input terminal, wherein the first and second input terminals are configured to receive the asymmetric pulse and asymmetric reference pulse signals;
   a first pulse amplification and stretching circuit configured to increase the amplitude and expand the bandwidth of the asymmetric pulse signal;
   a second pulse amplification and stretching circuit configured to further increase the amplitude and expand the bandwidth of the asymmetric pulse signal; and
   a first output terminal and a second output terminal configured to drive the pair of pulse shaping output signals.

7. The laser driver circuit of claim 4, wherein the transition compensating circuit comprises:
   a first amplification circuit, wherein the first amplification circuit is configured to generate a pair of transition compensating signals in response to the pair of differential input signals;
   a second amplification circuit and a third amplification circuit, wherein the second and third amplification circuits are configured to generate a pair of delayed and inverted transition compensating signals for canceling the pair of transition compensating signals generated by the first amplification circuit; and
   a pair of output terminals comprising a first output terminal and a second output terminal, wherein the first output terminal is configured to combine a first transition compensating output signal generated by the first amplification circuit and a corresponding first delayed and inverted transition compensating output signal generated by the second and third amplification circuits to form a first transition compensating pulse signal, and wherein the second output terminal is configured to combine a second transition compensating output signal generated by the first amplification circuit and a corresponding second delayed and inverted transition compensating output signal generated by the second and third amplification circuits to form a second transition compensating pulse signal.

* * * * *

UNITED STATES PATENT AND TRADEMARK OFFICE
CERTIFICATE OF CORRECTION

PATENT NO.       : 7,133,429 B2
APPLICATION NO.  : 11/075064
DATED            : November 7, 2006
INVENTOR(S)      : Timothy G. Moran It is certified that error appears in the above-identified patent and that said Letters Patent is hereby corrected as shown below:

Drawings
Sheet 8, replace FIG. 6A with the figure depicted herein below, wherein the labels "Q66" and "Q67" have been added.

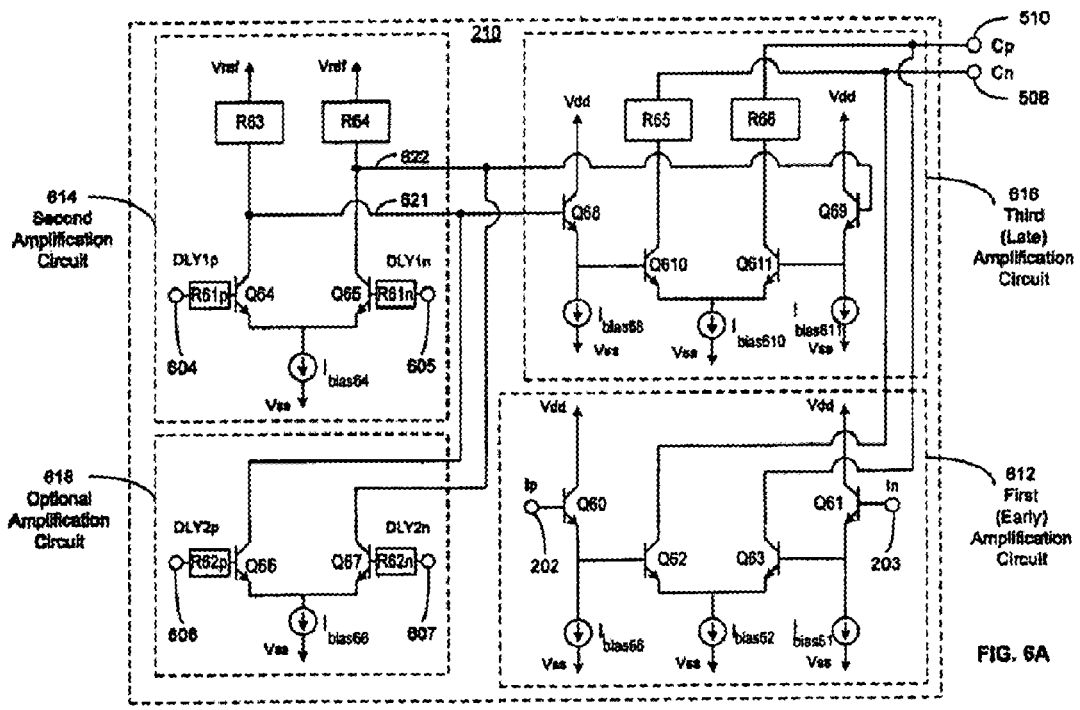

FIG. 6A

Column 3
Line 59, after "214", remove "Oz"
Line 64, after "output bias" remove "214"
Line 67, change "DL Yip, DL Y In, or DL Y 2p, DL Y 2n" to --$DLY_{1p}$, $DLY_{1n}$, or $DLY_{2p}$, $DLY_{2n}$--

Column 5
Line 17, change "Q35" to --Q36--
Line 31, change "208" to --206--

UNITED STATES PATENT AND TRADEMARK OFFICE
CERTIFICATE OF CORRECTION

PATENT NO. : 7,133,429 B2
APPLICATION NO. : 11/075064
DATED : November 7, 2006
INVENTOR(S) : Timothy G. Moran It is certified that error appears in the above-identified patent and that said Letters Patent is hereby corrected as shown below:

Column 6
Line 50, after "delay T", insert --334--

Column 8
Line 15, change "DLY1p and DL Y1n" to --$DLY_{1p}$ and $DLY_{1n}$--
Line 16, change "DLY2p and DLY2n" to --$DLY_{2p}$ and $DLY_{2n}$--

Column 9
Line 22, change "66" to --506--
Line 28, change "$I_{bias52}$" to --$I_{bias54}$--
Line 41, change "$I_{bias52}$" to --$I_{bias54}$--
Line 45, change "RC5 1" to --RC51--

Column 10
Line 66, change "7c" to --7C--

Column 11
Line 63, change "$I_{bias61}$" to --$I_{bias60}$--

Column 12
Line 3, change "Q2" to --Q62--
Line 7, change "$I_{bias66}$" to --$I_{bias62}$--
Line 66, change "$I_{bias69}$" to --$I_{bias611}$--

Column 13
Line 50, change "$I_{bias58}$" to --$I_{bias68}$--

Column 14
Line 4, change "68" to --6B--
Line 37, change "Q0 and Q1" to --Q70 and Q71--

Column 15
Line 6, change "R70 and R71" to --R40 and R41--

UNITED STATES PATENT AND TRADEMARK OFFICE
CERTIFICATE OF CORRECTION

PATENT NO.         : 7,133,429 B2
APPLICATION NO.    : 11/075064
DATED              : November 7, 2006
INVENTOR(S)        : Timothy G. Moran It is certified that error appears in the above-identified patent and that said Letters Patent is hereby corrected as shown below:

Column 16
Line 47, change "R6 and R7" to --R36 and R37--

Column 18
Line 7, change "differential, amplifier" to --differential amplifier--

Signed and Sealed this

Ninth Day of December, 2008

JON W. DUDAS
*Director of the United States Patent and Trademark Office*